United States Patent
Terashi

(10) Patent No.: US 8,344,762 B2
(45) Date of Patent: Jan. 1, 2013

(54) GATE DRIVING CIRCUIT

(75) Inventor: Hiroto Terashi, Tokyo (JP)

(73) Assignee: TDK-Lambda Corporation, Tokyo (JP)

(*) Notice: Subject to any disclaimer, the term of this patent is extended or adjusted under 35 U.S.C. 154(b) by 405 days.

(21) Appl. No.: 12/654,498

(22) Filed: Dec. 22, 2009

(65) Prior Publication Data

US 2010/0165664 A1    Jul. 1, 2010

(30) Foreign Application Priority Data

Dec. 26, 2008 (JP) ................................ 2008-335092

(51) Int. Cl.
*H03K 3/00* (2006.01)
(52) U.S. Cl. ........................................ 327/108; 327/112
(58) Field of Classification Search .................. 327/108, 327/112
See application file for complete search history.

(56) References Cited

U.S. PATENT DOCUMENTS

| | | | |
|---|---|---|---|
| 5,019,719 A * | 5/1991 | King | 327/110 |
| 5,544,102 A * | 8/1996 | Tobita et al. | 365/189.09 |
| 6,583,993 B2 * | 6/2003 | Hua | 363/21.06 |
| 6,970,023 B2 * | 11/2005 | Fedigan | 327/109 |
| 7,489,166 B2 * | 2/2009 | Honda | 327/108 |

FOREIGN PATENT DOCUMENTS

| | | |
|---|---|---|
| JP | A-5-207731 | 8/1993 |
| JP | A-2006-54954 | 2/2006 |
| JP | A-2008-136326 | 6/2008 |

* cited by examiner

*Primary Examiner* — Hai L Nguyen
(74) *Attorney, Agent, or Firm* — Oliff & Berridge, PLC

(57) ABSTRACT

A primary circuit turns on switching elements and generates energy from a direct-current power supply to a secondary circuit through a transformer. The secondary circuit charges a driven element using the energy obtained from the primary circuit through the transformer, turns on a switching element, discharges the energy accumulated in the driven element, and generates the energy in the primary circuit through the transformer. The primary circuit returns the energy obtained from the secondary circuit to the direct-current power supply.

2 Claims, 5 Drawing Sheets

GATE DRIVING CIRCUIT

CROSS-REFERENCE TO RELATED APPLICATIONS

This application is based upon and claims the benefit of priority from Japanese Patent Application No. 2008-335092, filed Dec. 26, 2008, the entire contents of which are incorporated herein by reference.

BACKGROUND OF THE INVENTION

1. Field of the Invention

The Invention relates to a gate driving circuit that drives a switching element having a MOS gate structure, such as a MOSFET or an IGBT.

2. Description of the Related Art

In recent years, a conversion frequency in a switching power supply apparatus has increased as it has been requested to decrease a size of an apparatus. For this reason, in a metal-oxide semiconductor field-effect transistor (MOSFET) that is used as a main switching element of the switching power supply apparatus, a gate driving circuit that supplies a high-speed gate driving signal between a gate and a source is provided. In particular, a technology for regenerating surplus energy accumulated in the gate driving circuit to the side of a direct-current power supply using a resonance circuit including a capacitor between the gate and the source of the MOSFET and an inductance element, decreasing a gate driving loss of the MOSFET, and switching the MOSFET at a high speed is disclosed in Japanese Patent Application Publication (KOKAI) Nos. 5-207731 and 2006-54954.

However, since gate driving circuits that are disclosed Japanese Patent Application Publication (KOKAI) Nos. 5-207731 and 2006-54954 is configured in consideration of a non-insulating power supply apparatus, the gate driving circuits cannot be applied to an insulating power supply apparatus.

The gate driving circuits that are disclosed in Japanese Patent Application Publication (KOKAI) Nos. 5-207731 and 2006-54954 include a charging circuit, a discharging circuit, first and second power regenerating circuits, a zero-voltage clamping circuit having a switching element, an inductance element, and a zero-voltage clamping element, and a driving voltage clamping circuit having a switching element, an inductance element, and a driving voltage clamping element. For this reason, in each gate driving circuit, the circuit configuration is complicated, and control of individual switching elements constituting each gate driving circuit also becomes complicated.

SUMMARY OF THE INVENTION

A gate driving circuit according to an aspect of the present invention includes a primary circuit and a secondary circuit. The primary circuit includes a direct-current power supply, a primary winding, a first switching element connected between one end of the primary winding and a positive electrode of the direct-current power supply, a first unidirectional element connected to both ends of the first switching element to block a current from the direct-current power supply, a second switching element connected between the other end of the primary winding and a negative electrode of the direct-current power supply, and a second unidirectional element connected to both ends of the second switching element to block the current from the direct-current power supply. The secondary circuit includes a driven element having a MOS gate structure, a secondary winding, an inductance element, and a third switching element, the driven element being connected to the secondary circuit so that the secondary winding, the inductance element, the third switching element, and the driven element forms a closed circuit, the secondary winding being magnetically coupled to the primary winding to form a transformer. The primary circuit generates energy from the direct-current power supply in the secondary circuit through the transformer, and returns the energy obtained from the secondary circuit through the transformer to the direct-current power supply. The secondary circuit charges the driven element using the energy obtained from the primary circuit through the transformer, and discharges the energy accumulated in the driven element to generate the energy in the primary circuit through the transformer.

A gate driving circuit according to another aspect of the present invention includes a primary circuit; a first secondary circuit; and a second secondary circuit. The primary circuit includes a direct-current power supply, a first primary winding, a second primary winding, a first switching element configured to form a closed circuit together with the first primary winding and the direct-current power supply which are connected in series, a first unidirectional element connected to both ends of the first switching element to block a current from the direct-current power supply, a second switching element configured to form a closed circuit together with the second primary winding and the direct-current power supply which are connected in series, and a second unidirectional element connected to both ends of the second switching element to block a current from the direct-current power supply. The first secondary circuit includes a first driven element having a MOS gate structure, a first secondary winding, a first inductance element, a third switching element, and a third unidirectional element so that the first driven element, the first secondary winding, the first inductance element, and the third unidirectional element form a closed circuit with a current flowing due to an induced voltage generated in the first secondary winding when a current from the direct-current power supply flows into the first primary winding, the first secondary winding being magnetically coupled to the first primary winding to form a transformer. The second secondary circuit includes a second driven element having a MOS gate structure, a second secondary winding, a second inductance element, a fourth switching element, and a fourth unidirectional element so that the second driven element, the second secondary winding, the second inductance element, and the fourth unidirectional element form a closed circuit with a current flowing due to an induced voltage generated in the second secondary winding when a current from the direct-current power supply flows into the second primary winding, the second secondary winding being magnetically coupled to the second primary winding to form the transformer. The primary circuit includes energy from the direct-current power supply in the first and second secondary circuits through the transformer, and returns the energy obtained form the first and second secondary circuits through the transformer to the direct-current power supply. The first secondary circuit charges the first driven element using the energy obtained from the primary circuit through the transformer, and discharges the energy accumulated in the first driven element to generate the energy in the primary circuit through the transformer. The second secondary circuit charges the second driven element using the energy obtained from the primary circuit through the transformer, and discharges the energy accumulated in the second driven element to generate the energy in the primary circuit through the transformer.

The above and other features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, exemplary embodiments of the gate driving circuit according to invention will be described in detail with reference to the accompanying drawings. However, the invention is not limited to the exemplary embodiments.

First Embodiment

Figure 1:
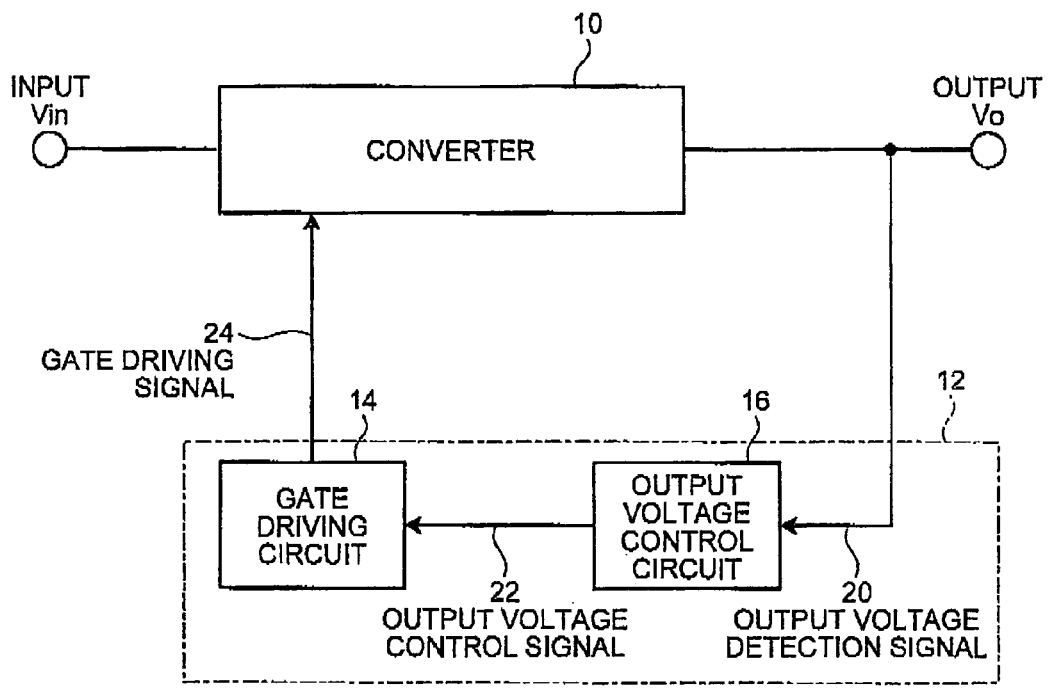
FIG. 1 is a diagram illustrating the configuration of a power supply apparatus that mounts a gate driving circuit according to a first embodiment of the invention.

Configuration of a power supply apparatus where a gate driving circuit is mounted FIG. 1 illustrates the configuration of a power supply apparatus that mounts a gate driving circuit according to a first embodiment of the invention. The power supply apparatus that is illustrated in FIG. 1 includes a converter 10, a gate driving circuit 14 that corresponds to the gate driving circuit in this invention, and an output voltage control circuit 16. The converter 10 is a DC/DC converter that converts a direct current voltage, and converts an input Vin corresponding to a direct current input into an output Vo corresponding to a direct current output and outputs the output Vo. The gate driving circuit 14 and the output voltage control circuit 16 constitute a feedback control system 12 to stabilize an output voltage. The output voltage control circuit 16 generates an output voltage control signal 22 to control the gate driving circuit 14, on the basis of a detection signal of an output voltage (output voltage detection signal 20) of the output Vo, and outputs the output voltage control signal 22. The gate driving circuit 14 generates a driving signal (gate driving signal 24) to control a main switching element included in the converter 10, on the basis of the output voltage control signal 22, and outputs the driving signal. In the configuration of FIG. 1, only the output Vo is illustrated as the output voltage generated on the basis of the input Vin. However, plural or plural kinds of direct current outputs may be generated from one direct current input.

Characteristic of the Power Supply Apparatus

Next, a characteristic of the power supply apparatus will be described. For example, power supply apparatuses that are mounted in personal computers are required to have specifications according to characteristics of various apparatuses, such as a CPU, a hard disk, a USB apparatus, and a cooling fan. Among them, in the power supply apparatus that drives the CPU, a high-speed switching operation is required to adjust to an increase in speed of a clock frequency, a decrease in input voltage, and a rapid change in current (increase in current) generated by repetition of the operation of waiting→starting→waiting are required.

Configuration of the Gate Driving Circuit

Figure 2:
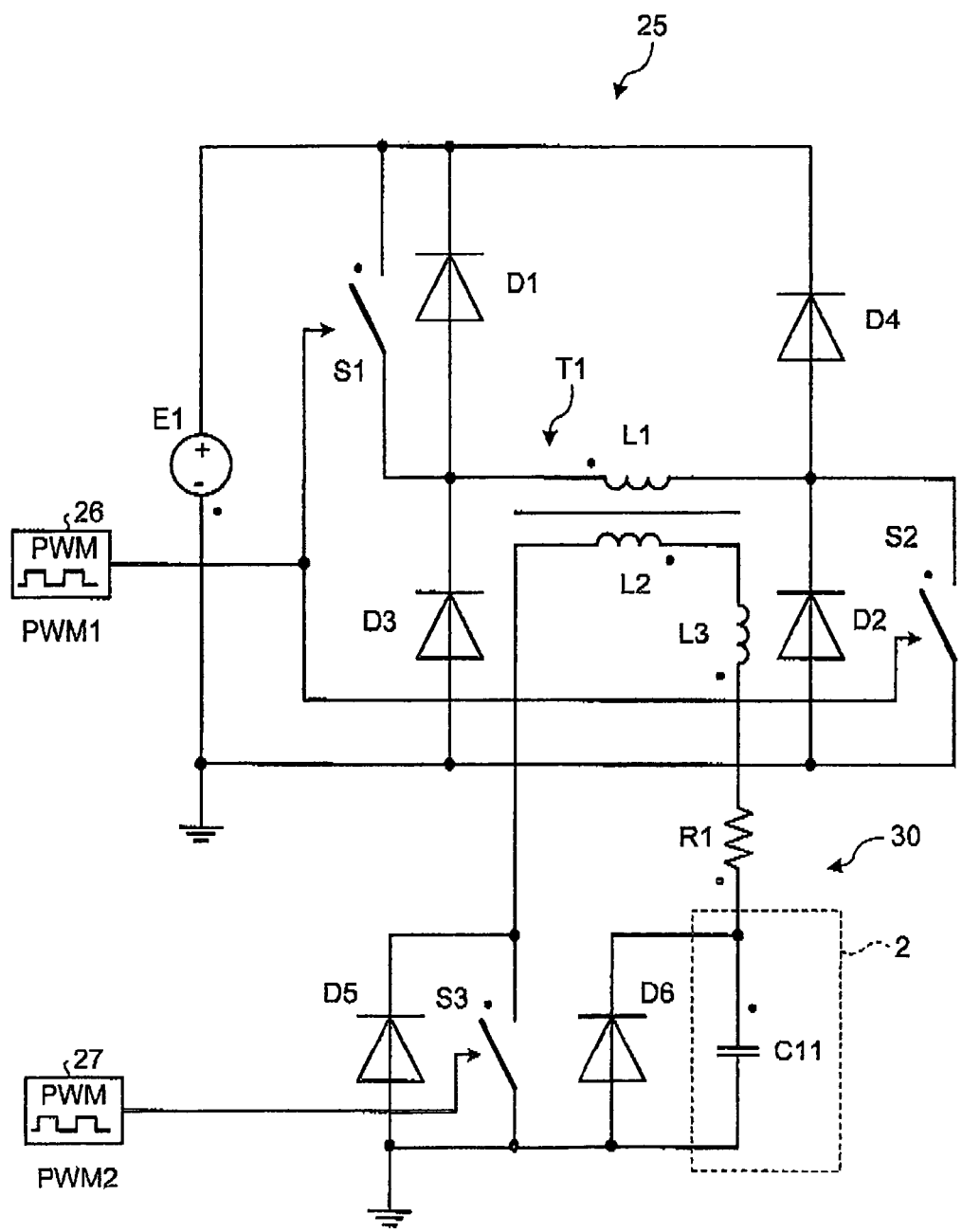
FIG. 2 is a circuit diagram illustrating the configuration of the gate driving circuit in the first embodiment.

Next, the configuration of the gate driving circuit according to the first embodiment of the invention will be described. FIG. 2 is a circuit diagram illustrating the configuration of the gate driving circuit in the first embodiment.

In FIG. 2, in the gate driving circuit according to the first embodiment, a primary circuit 25 and a secondary circuit 30 are configured through a transformer T1 having a primary winding L1 and a secondary winding L2.

The primary circuit 25 includes a direct-current power supply E1, the primary winding L1 of the transformer T1, diodes D1 to D4 functioning as unidirectional elements, and switching elements S1 and S2. In the primary circuit 25, an anode of the diode D1 and a cathode of the diode D3 are connected in series to abut on each other, and an anode of the diode D4 and a cathode of the diode D2 are connected in series to abut on each other. Cathodes of the diodes D1 and D4 are connected to each other and anodes of the diodes D2 and D3 are connected to each other, and connection ends thereof are connected to the direct-current power supply E1 such that a positive electrode becomes the side of the cathode of the diode D1 and a negative electrode becomes the side of the anode of the diode D2. In connection ends of the diodes D1 and D3 and the diodes D2 and D4, the primary winding L1 of the transformer T1 is connected. In both ends of the diode D1, the switching element S1 is connected in parallel. In both ends of the diode D2, the switching element S2 is connected in parallel. As will be described below, the diodes D1 and D2 function as regenerating elements to return energy accumulated in a gate input capacitor C11 to the direct-current power supply E1, and the diodes D3 and D4 function as regenerating elements to return energy generated by an excitation current to the direct-current power supply.

The secondary circuit 30 includes the gate input capacitor C11 of a driven element 2 composed of a MOSEFT, the secondary winding L2 of the transformer T1, an inductance element L3, a resistor element R1, diodes D5 and D6 functioning as unidirectional elements, and a switching element S3. In the secondary circuit 30, the secondary winding L2 of the transformer T1, the inductance element L3, the resistor element R1, and the switching element S3 are connected in series to the gate input capacitor C11, the diode D6 is connected in parallel to both ends of the gate input capacitor C11, and the diode D5 is connected in parallel to both ends of the switching element S3. A cathode of the diode D6 is connected to one end (dot end side) of the gate input capacitor C11 and an anode thereof is connected to the other end (non-dot end side). A cathode of the diode D5 is connected to one end (dot end side) of the switching element S3 and an anode thereof is connected to the other end (non-dot end side) of the switching element S3.

In the configuration of FIG. 2, the switching elements S1 and S2 are turned on/off by a pulse signal (PWM signal) output from a PWM controller 26, and the switching element S3 is turned on/off by a pulse signal (PWM signal) output from a PWM controller 27. In FIG. 2, the configuration that includes the diode D5 connected in parallel to the switching element S3 is illustrated. However, when an FET is used as the switching element, the diode may be replaced by a body diode that is structurally included in the FET.

(Operation of the Gate Driving Circuit)

Figure 3:
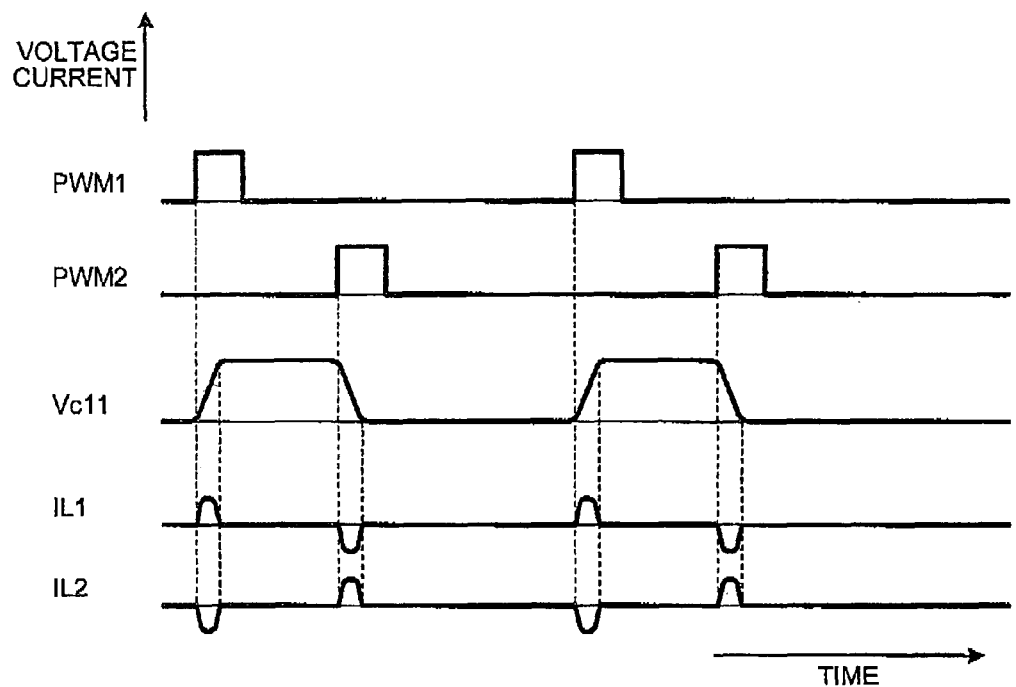
FIG. 3 is a waveform diagram of essential components in the gate driving circuit of FIG. 2.

FIG. 3 is a waveform diagram of essential components in the gate driving circuit of FIG. 2. In FIG. 3, a waveform PWM1 is a waveform of a signal that is applied from the PWM controller 26 to the switching elements S1 and S2, and a waveform PWM2 is a waveform of a signal that is applied from the PWM controller 27 to the switching element S3. A voltage Vc11 is a voltage (voltage causing the dot end side to become a positive electrode) at both ends of the gate input capacitor C11. A current IL1 is a current (current causing the dot end side to become the positive electrode, when the current flows into the dot end) that flows into the primary winding L1 of the transformer T1, and a current IL2 is a current (current causing the dot end side to become the positive electrode, when the current flows into the dot end) that flows into the secondary winding L2 (inductance element L3) of the transformer T1. In FIG. 3, in regards to the currents IL1 and 1L2, only a charge current with respect to the gate input capacitor C11 and a discharge current from the gate input capacitor C11 are illustrated. In actuality, waveforms are slightly different from the waveforms illustrated in FIG. 3, including an excitation current needed for an excitation of the transformer T1, but this is not essential in terms of the operation of the gate driving circuit. For this reason, the description is hereinafter given using the waveforms of the currents IL1 and IL2 illustrated in FIG. 3.

Figure 4:
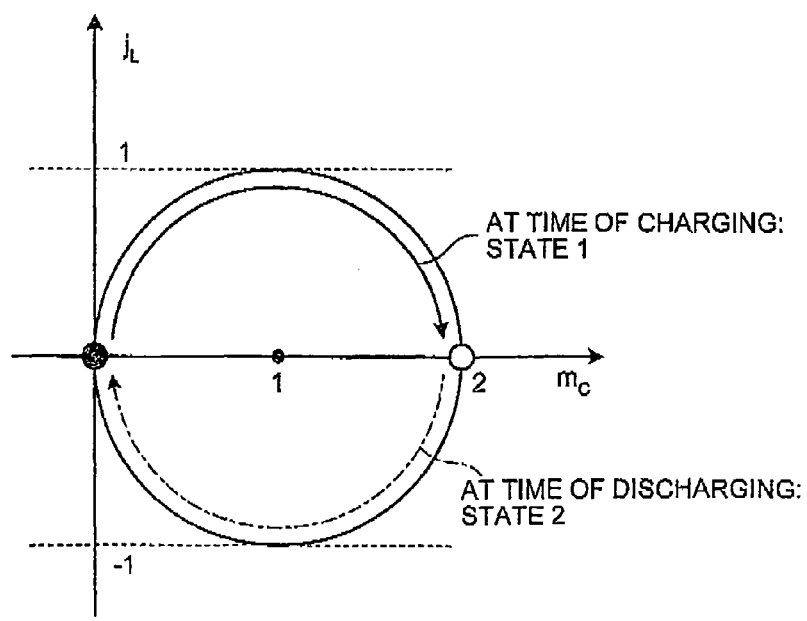
FIG. 4 is a state transition diagram of a driven element where the gate driving circuit of FIG. 2 is applied.

FIG. 4 is a state transition diagram of a driven element where the gate driving circuit of FIG. 2 is applied. In FIG. 4, a vertical axis $j_L$ indicates a current value of the inductance element L3 that is regulated such that a maximum value of a charge current becomes "1", on the basis of an input voltage Vi and characteristic impedance Z. A horizontal axis $m_C$ indicates a voltage value of the gate input capacitor C11 that is regulated by the input voltage Vi. The characteristic impedance Z is determined on the basis of a capacity of the gate input capacitor C11 and inductance of the inductance element L3.

Next, the operation of the gate driving circuit according to the first embodiment will be described with reference to the individual drawings.

First, the PWM controller 26 applies an ON pulse to the switching elements S1 and S2 to turn on the driven element 2. At this time, the switching elements S1 and S2 are turned on, and a closed circuit of the positive electrode of the direct-current power supply E1→the switching element S1→the primary winding L1 of the transformer T1→the switching element S2→the negative electrode of the direct-current power supply E1 is formed in the primary circuit 25. Since the current that flows into the primary winding L1 of the transformer T1 does not rapidly change, a voltage that causes the dot end side to become the negative electrode is generated in the primary winding L1, a voltage that causes the dot end side to become the positive electrode is generated in the secondary winding L2 that is magnetically coupled to the primary winding L1, and the current IL1 illustrated in FIG. 3 flows (since the current is a current flowing into the dot end of the primary winding L1, the current becomes a positive current as illustrated in FIG. 3).

Meanwhile, in the secondary circuit 30, using the voltage generated in the secondary winding L2 as a power supply voltage, a closed circuit of one end (dot end side) of the secondary winding L2→the inductance element L3→the resistor element R1→the gate input capacitor C11→the diode D5→the other end (non-dot end side) of the secondary winding L2 is formed, and the gate input capacitor C11 is charged. At this time, the current IL2 illustrated in FIG. 3 flows (since the current is a current flowing from the dot end of the secondary winding L2, the current becomes a negative current as illustrated in FIG. 3). The current is a resonance current by a capacitance component of the gate input capacitor C11 and an inductance component of the inductance element L3, and energy that is accumulated in the inductance element L3 moves to the gate input capacitor C11. The resistor element R1 has a low resistance value in the actual gate driving circuit, and rarely affects the magnitude of the resonance current.

At this time, the operation is represented by a state 1 of the state transition diagram illustrated in FIG. 4. In FIG. 4, during a period of time until the switching elements S1 and S2 are turned on and the wavelength reaches the ¼ wavelength of a series resonance current waveform by the charging operation of the gate input capacitor C11 from an initial state immediately before the switching elements S1 and S2 are turned on, the current that flows into the gate input capacitor C11 gradually increases from zero, and the voltage at both ends of the gate input capacitor C11 (refer to the waveform of the voltage Vc11 of FIG. 3) also gradually Increases from zero. Meanwhile, if the wavelength reaches the ¼ wavelength of the series resonance current waveform, the current that flows into the gate input capacitor C11 is maximized, and the voltage becomes equal to the voltage of the direct-current power supply E1 (when a winding ratio of the transformer T1 is 1:1). Then, the voltage further increases, but the current gradually decreases. If the wavelength reaches the ½ wavelength of the series resonance current waveform, the current becomes zero, and a voltage that is two times larger than the voltage of the direct-current power supply E1 is accumulated in the gate input capacitor C11.

In this way, the driven element 2 is turned on by the increasing the potential of the gate input capacitor C11 of the driven element 2. However, if the voltage of the gate input capacitor C11 increases, the current that flows into the gate input capacitor C11 becomes zero. Since the switching element S3 of the secondary circuit 30 is turned off, the driven element 2 maintains an ON state without depending on ON/OFF states of the switching elements S1 and S2. Accordingly, timing when the switching elements S1 and S2 are turned off may be within a period of time immediately before the switching element S3 is turned on to turn off the driven element 2, after the wavelength exceeds the ¼ wavelength of the series resonance current waveform when the gate input capacitor C11 is charged, and a temporal restriction can be reduced.

Next, the PWM controller 27 applies an ON pulse to the switching element S3 to turn off the driven element 2. At this time, the switching element S3 is turned on, a closed circuit of the positive electrode (dot end side) of the gate input capacitor C11→the resistor element R1→the inductance element L3→the secondary wining line L2→the switching element S3→the negative electrode (non-dot end side) of the gate input capacitor C11 is formed in the secondary circuit 30, and a charge that is accumulated in the gate input capacitor C11 is discharged. Since the current that flows into the secondary winding L2 of the transformer T1 does not rapidly change, a voltage that causes the dot end side to become the positive electrode is generated in the secondary winding L2, a voltage that causes the dot end side to become the positive electrode is generated in the primary winding L1 that is magnetically coupled to the secondary winding L2, and the current IL2 illustrated in FIG. 3 flows (since the current is a current flowing into the dot end of the secondary winding L2, the current becomes a positive current as illustrated in FIG. 3).

Meanwhile, in the primary circuit 25, using a potential difference between the voltage (voltage that is two times larger than the voltage of the direct-current power supply E1) generated in the primary winding L1 and the voltage of the direct-current power supply E1, a closed circuit of one end (dot end side) of the primary winding L1→the diode D1→the direct-current power supply E1→the diode D2→the other end (non-dot end side) of the primary winding L1 is formed, and the current IL1 illustrated in FIG. 3 flows (since the current is a current flowing from the dot end of the primary winding L1, the current becomes a negative current as illustrated in FIG. 3). The current is a resonance current by a capacitance component of the gate input capacitor C11 and an inductance component of the inductance element L3, and energy that is accumulated in the gate input capacitor C11 is returned to the direct-current power supply E1 through the transformer T1.

At this time, the operation is represented by a state 2 of the state transition diagram illustrated in FIG. 4. In FIG. 4, during a period of time until the switching element S3 is turned on and the wavelength reaches the ¼ wavelength of a series resonance current waveform by the discharging operation of the gate input capacitor C11 from a state immediately before the switching element S3 is turned on, the current that flows from the gate input capacitor C11 gradually increases from zero, and the voltage at both ends of the gate input capacitor C11 (refer to the waveform of the voltage Vc11 of FIG. 3) gradually decreases from the voltage two times larger than the voltage of the direct-current power supply E1. Meanwhile, if the wavelength reaches the ¼ wavelength of the series resonance current waveform, the current that flows from the gate input capacitor C11 is minimized, and the voltage becomes equal to the voltage of the direct-current power supply E1 (when a winding ratio of the transformer T1 is 1:1). Then, the current gradually decreases and the voltage further decreases. If the wavelength reaches the ½ wavelength of the series resonance current waveform, the current from the gate input capacitor C11 becomes zero, the voltage at both ends of the gate input capacitor C11 also becomes zero, and the energy that is accumulated in the gate input capacitor C11 is returned to the direct-current power supply E1.

In this way, the driven element 2 is turned off by the decreasing the potential of the gate input capacitor C11 of the driven element 2. Since the switching elements S1 and S2 of the primary circuit 25 are turned off, the driven element 2 is not charged and maintains an OFF state, without depending on an ON/OFF state of the switching element S3. Accordingly, timing when the switching element S3 is turned off may be within a period of time immediately before the switching elements S1 and S2 are turned on to turn on the driven element 2, after the wavelength exceeds the ¼ wavelength of the series resonance current waveform when the gate input capacitor C11 is discharged, and a temporal restriction can be reduced.

In the above-described gate driving circuit, when the gate input capacitor C11 of the driven element 2 is charged or discharged, a loss is actually generated. For this reason, the energy cannot be completely returned to the direct-current power supply E1. Accordingly, in a trace of the current and the voltage in the state transition diagram of FIG. 4, its radius gradually decreases. If the loss is not generated, the radius of the trace of the current and the voltage can be constantly maintained.

In the above description, the diodes D1 and D2 operate as the regenerating elements to return (regenerate) the energy accumulated in the gate input capacitor C11 to the direct-current power supply E1. However, similar to the diodes D1 and D2, the diodes D3 and D4 operate as the regenerating elements. Specifically, when the switching elements S1 and S2 are turned off, the current that flows into the primary winding L1 of the transformer T1 is returned (regenerated) to the direct-current power supply E1 through the diodes D3 and D4. That is, the diodes D3 and D4 prevent the current flowing into the primary winding L1 of the transformer T1 from losing a place to flow, and realize the operation of smoothly returning (regenerating) the current to the direct-current power supply E1. After the charge that is accumulated in the gate input capacitor C11 moves to the primary circuit 25, a resonance of the inductance element L3 and the gate input capacitor C11 is continued, and the diode D6 is supplied with power to suppress the negative charge from being accumulated in the gate input capacitor C11.

As described above, in the gate driving circuit according to the first embodiment, the primary circuit 25 turns on the switching elements S1 and S2 and generates the energy from the direct-current power supply E1 in the secondary circuit 30 through the transformer T1. The secondary circuit 30 charges the driven element 2 using the energy obtained from the primary circuit 25 through the transformer T1, turns on the switching element S3, discharges the energy accumulated in the driven element 2, and generates the energy in the primary circuit 25 through the transformer T1. Since the primary circuit 25 operates to return the energy obtained from the secondary circuit 30 to the direct-current power supply E1, the primary circuit can adjust to the high frequency, and the simple circuit configuration and easy control are enabled.

Since the gate driving circuit according to the first embodiment can insulate the driven element and the direct-current power supply from each other through the transformer, the gate driving circuit can be mounted in an apparatus that requires an insulating power supply apparatus, because of safety.

In the gate driving circuit according to the first embodiment, the timing when the switching elements S1 and S2 are turned off may be within a period of time immediately before the switching element S3 is turned on to turn off the driven element 2, after the wavelength exceeds the ¼ wavelength of the series resonance current waveform when the gate input capacitor C11 is charged. The timing when the switching element S3 is turned off may be within a period of time immediately before the switching elements S1 and S2 are turned on to turn on the driven element 2, after the wavelength exceeds the ¼ wavelength of the series resonance current waveform when the gate input capacitor C11 is discharged. Therefore, the temporal restriction of when the energy is returned to the direct-current power supply E1 can be reduced.

In the gate driving circuit according to the first embodiment, since a rising edge and a falling edge of the waveform of the gate voltage are not rapid, generation of the noise is small.

Second Embodiment

Figure 5:
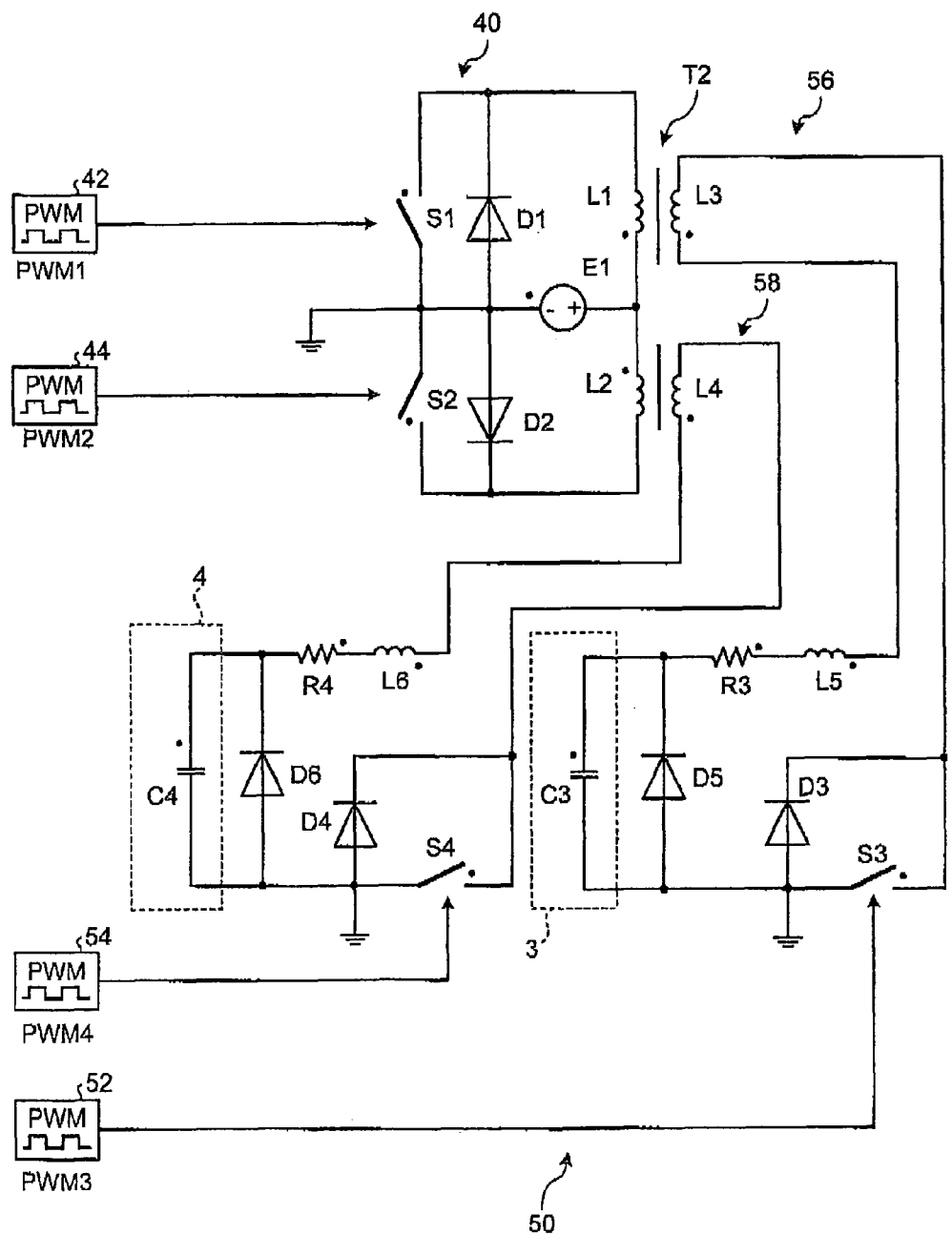
FIG. 5 is a circuit diagram illustrating the configuration of a gate driving circuit according to a second embodiment of the invention.

Next, a gate driving circuit according to a second embodiment of the invention will be described. FIG. 5 is a circuit diagram illustrating the configuration of a gate driving circuit according to a second embodiment. As illustrated in FIG. 2, the gate driving circuit according to the first embodiment has the configuration of a so-called forward type in which the direct-current power supply is connected to the primary side of the transformer and one driven element is connected to the secondary side of the transformer. Meanwhile, as illustrated in FIG. 5, the gate driving circuit according to the second embodiment has the configuration of a so-called push/pull type in which a direct-current power supply is connected to the primary side of the transformer, two driven elements are connected to the secondary side of the transformer, and the two driven elements are alternately driven.

Configuration of the Gate Driving Circuit

In FIG. 5, in the gate driving circuit according to the second embodiment, a primary circuit 40 and a secondary circuit 50 are configured through a transformer T2 having first and second primary windings L1 and L2 and first and second secondary windings L3 and L4.

The primary circuit 40 includes a direct-current power supply E1, the first and second primary windings L1 and L2 of the transformer T2, diodes D1 and D2 functioning as unidirectional elements, and switching elements S1 and S2. In the primary circuit 40, anodes of the diodes D1 and D2 are connected in series to abut on each other. The switching element S1 is connected in parallel to both ends of the diode D1, and the switching element S2 is connected in parallel to both ends of the diode D2. A cathode of the diode D1 is connected to the side of one end (side of a dot end) of the first primary winding L1 and a cathode of the diode D2 is connected to the side of one end (side of a non-dot end) of the second primary winding L2, such that the first and second primary windings L1 and L2 of the transformer T2 are connected in series and connected in parallel to both ends of a series circuit by the diodes D1 and D1. Between a connection end of the first and second primary windings L1 and L2 connected in series and a connection end of the diodes D1 and D2, the direct-current power supply E1 is connected such that a positive electrode becomes the side of a connection end of the first and second primary windings L1 and L2 and a negative electrode becomes the side of a connection end of the diodes D1 and D2.

The secondary circuit 50 includes a first secondary circuit 56 and a second secondary circuit 58 having the same circuit configuration. The first secondary circuit 56 includes a gate input capacitor C3 of a driven element 3 composed of a MOSFET, the first secondary winding L3 of the transformer T2, an inductance element L5, a resistor element R3, diodes D3 and D5 functioning as unidirectional elements, and a switching element S3. In the first secondary circuit 56, the first secondary winding L3 of the transformer T2, the inductance element L5, the resistor element R3, and the switching element S3 are connected in series to the gate input capacitor C3, the diode is connected in parallel to both ends of the gate input capacitor C3, and the diode D3 is connected in parallel to both ends of the switching element S3. A cathode of the diode D5 is connected to the side of one end (side of the dot end) of the gate input capacitor C3 and an anode thereof is connected to the side of the other end (side of the non-dot end). A cathode of the diode D3 is connected to the side of one end (side of the dot end) of the switching element S3 and an anode thereof is connected to the side of the other end (side of the non-dot end) of the switching element S3. The second secondary circuit 58 has the same configuration as the first secondary circuit 56, including arrangement and connection of the elements. Referring to FIG. 5, an inductance element L6, a resistor element R4, a gate input capacitor C4, a diode D6, a diode D4, and a switching element S4 correspond to the inductance element L5, the resistor element R3, the gate input capacitor C3, the diode D5, the diode D3, and the switching element S3, respectively. Here, the second secondary circuit 58 is not explained in detail.

In the configuration of FIG. 5, the switching element S1 is turned on/off by a pulse signal (PWM signal) output from a PWM controller 42, the switching element S2 is turned on/off by a pulse signal (PWM signal) output from a PWM controller 44, the switching element S3 is turned on/off by a pulse signal (PWM signal) output from a PWM controller 52, and the switching element S4 is turned on/off by a pulse signal (PWM signal) output from a PWM controller 54.

Operation of the Gate Driving Circuit

Figure 6:
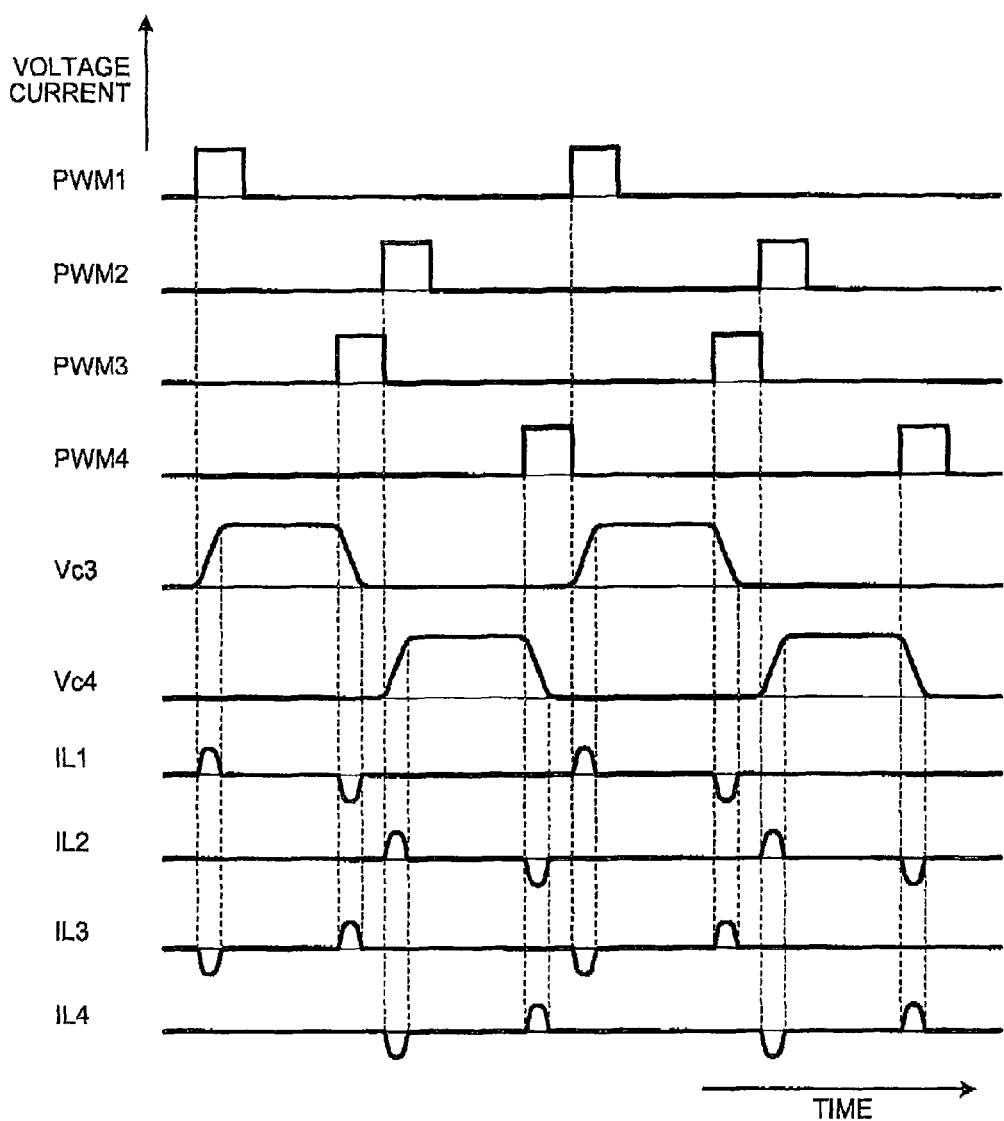
FIG. 6 is a waveform diagram of essential components in the gate driving circuit of FIG. 5.

FIG. 6 is a waveform diagram of essential components in the gate driving circuit of FIG. 5. In FIG. 6, a waveform PWM1 is a waveform of a signal that is applied from the PWM controller 42 to the switching element S1, a waveform PWM2 is a waveform of a signal that is applied from the PWM controller 44 to the switching element S2, a waveform PWM3 is a waveform of a signal that is applied from the PWM controller 52 to the switching element S3, and a waveform PWM4 is a waveform of a signal that is applied from the PWM controller 54 to the switching element S4. A voltage Vc3 is a voltage (voltage causing the dot end side to become a positive electrode) at both ends of the gate input capacitor C3, and a voltage Vc4 is a voltage (voltage causing the dot end side to become the positive electrode) at both ends of the gate input capacitor C4. A current IL1 is a current (current causing the dot end side to become the positive electrode, when the current flows into the dot end, which is applied to the following description) that flows into the first primary winding L1 of the transformer T2, a current IL2 is a current (current causing the dot end side to become a negative electrode, when the current flows into the dot end) that flows into the second primary winding L2 of the transformer T2, a current IL3 is a current that flows into the first secondary winding L3 of the transformer T2, and a current IL4 is a current that flows into the second secondary winding L4 of the transformer T2. In this case, in regards to the currents IL1 and IL3, only a charge current with respect to the gate input capacitor C3 and a discharge current from the gate input capacitor C3 are illustrated. This is applicable to the currents IL2 and IL4. In actuality, waveforms are slightly different from the waveforms illustrated in FIG. 6, including an excitation current needed for an excitation of the transformer T2, but this is not essential in terms of the operation of the gate driving circuit. For this reason, the description is hereinafter given using the waveforms of the currents IL1 to IL4 illustrated in FIG. 6.

Next, the operation of the gate driving circuit according to the second embodiment will be described with reference to FIGS. 5 and 6.

First, the PWM controller 42 applies an ON pulse to the switching element S1 to turn on a driven element 3. At this time, the switching element S1 is turned on, and a closed circuit of the positive electrode of the direct-current power supply E1→the first primary winding L1→the switching element S1→the negative electrode of the direct-current power supply E1 is formed in the primary circuit 40. Since the current that flows into the first primary winding L1 does not rapidly change, a voltage that causes the dot end side to become the positive electrode is generated in the first primary winding L1, voltage that causes the dot end side to become the positive electrode is generated in the first secondary winding L3 that is magnetically coupled to the first primary winding L1, and the current IL1 illustrated in FIG. 6 flows (since the current is a current flowing into the dot end of the first primary winding L1, the current becomes a positive current as illustrated in FIG. 6).

Meanwhile, in the first secondary circuit 56 of the secondary circuit 50, using the voltage generated in the first secondary winding L3 as a power supply voltage, a closed circuit of one end (dot end side) of the first secondary winding L3→the inductance element L5→the resistor element R3→the gate input capacitor C3→the diode D3→the other end (non-dot end side) of the first secondary winding L3 is formed, and the gate input capacitor C3 is charged. At this time, the current IL3 illustrated in FIG. 6 flows (since the current is a current flowing from the dot end of the first secondary winding L3, the current becomes a negative current as illustrated in FIG. 5). The current is a resonance current by a capacitance component of the gate input capacitor C3 and an inductance component of the inductance element L5, and energy that is accumulated in the first secondary winding L3 moves to the gate input capacitor C3. The resistor element R3 has a low resistance value in the actual gate driving circuit, and rarely affects the magnitude of the resonance current.

In this way, the driven element 3 is turned on by the increasing the potential of the gate input capacitor C3 of the driven element 3. However, if the voltage of the gate input capacitor C3 increases, the current that flows into the gate input capacitor C3 becomes zero. Since the switching element S3 of the first secondary circuit 56 is turned off, the driven element 3 maintains an ON state without depending on an ON/OFF state of the switching element Si.

Although the description is omitted, the state transition when the gate input capacitor C3 is charged is the same as that of the first embodiment illustrated in FIG. 4. Accordingly, in the primary circuit 40, timing when the switching element S1 is turned off may be within a period of time immediately before the switching element S3 is turned on to turn off the driven element 3, after the wavelength exceeds the ¼ wavelength of the series resonance current waveform when the gate input capacitor C3 is charged, and a temporal restriction can be reduced, similar to the first embodiment.

Next, the PWM controller 52 applies an ON pulse to the switching element S3 to turn off the driven element 3. At this time, the switching element S3 is turned on, a closed circuit of the positive electrode (dot end side) of the gate input capacitor C3→the resistor element R3→the inductance element L5→the first secondary wining line L3→the switching element S3→the negative electrode (non-dot end side) of the gate input capacitor C3 is formed in the first secondary circuit 56, and a charge that is accumulated in the gate input capacitor C3 is discharged. Since the current that flows into the first secondary winding L3 does not rapidly change, a voltage that causes the dot end side to become the positive electrode is generated in the first secondary winding L3, a voltage that causes the dot end side to become the positive electrode is generated in the first primary winding L1 that is magnetically coupled to the first secondary winding L3, and the current IL3 illustrated in FIG. 6 flows (since the current is a current flowing into the dot end of the first secondary winding L3, the current becomes a positive current as illustrated in FIG. 6).

Meanwhile, in the primary circuit 40, using a potential difference between the voltage (voltage that is two times larger than the voltage of the direct-current power supply E1) generated in the first primary winding L1 and the voltage of the direct-current power supply E1, a closed circuit of one end (dot end side) of the first primary winding L1→the direct-current power supply E1→the diode D1→the other end (non-dot end side) of the first primary winding L1 is formed, and the current IL1 illustrated in FIG. 6 flows (since the current is a current flowing from the dot end of the first primary winding L1, the current becomes a negative current as illustrated in FIG. 6). The current is a resonance current by a capacitance component of the gate input capacitor C3 and an inductance component of the inductance element L5, and energy that is accumulated in the gate input capacitor C3 is returned to the direct-current power supply E1 through the transformer T2.

In FIG. 5, after the charge that is accumulated in the gate input capacitor C3 moves to the primary circuit 40, a resonance of the inductance element L5 and the gate input capacitor C3 is continued, and the diode D5 is supplied with power to suppress the negative charge from being accumulated in the gate input capacitor C3.

Although the description is omitted, the state transition when the gate input capacitor C3 is discharged is the same as that of the first embodiment illustrated in FIG. 4. Accordingly, in the first secondary circuit 56, timing when the switching element S3 is turned off may be within a period of time immediately before the switching element S1 is turned on to turn off the driven element 3, after the wavelength exceeds the ¼ wavelength of the series resonance current waveform when the gate input capacitor C3 is discharged, and a temporal restriction can be reduced, similar to the first embodiment.

The above description relates to the operation of when the driven element 3 is turned on/off, but this is applicable to the operation of when the driven element 4 is turned on/off. The PWM controllers 44 and 54 may perform the same timing control as that in the above case, with respect to the switching elements S2 and S4.

As described above, in the gate driving circuit according to the second embodiment, the primary circuit 40 turns on the switching elements S1 and S2 and generates the energy from the direct-current power supply E1 to the first secondary circuit 56 and the second secondary circuit 58 through the transformer T2. The first secondary circuit 56 charges the driven element 3 using the energy obtained from the primary circuit 40 through the transformer T2, discharges the energy accumulated in the driven element 3, and generates the energy in the primary circuit 40 through the transformer T2. The second secondary circuit 58 charges the driven element 4 using the energy obtained from the primary circuit 40 through the transformer T2, discharges the energy accumulated in the driven element 4, and generates the energy in the primary circuit 40 through the transformer T2. Since the primary circuit 40 operates to return the energy obtained from the first secondary circuit 56 and the second secondary circuit 5B to the direct-current power supply E1, the primary circuit can adjust to the high frequency, and the simple circuit configuration and easy control are enabled.

Since the gate driving circuit according to the second embodiment can insulate the driven elements and the direct-current power supply from each other through the transformer, the gate driving circuit can be mounted in an apparatus that requires an insulating power supply apparatus, because of safety.

In the gate driving circuit according to the second embodiment, the timing when the switching element S1 is turned off may be within a period of time immediately before the switching element S3 is turned on to turn off the driven element 3, after the wavelength exceeds the ¼ wavelength of the series resonance current waveform when the gate input capacitor C3 is charged. The timing when the switching element S2 is turned off may be within a period of time immediately before the switching element S4 is turned on to turn off the driven element 4, after the wavelength exceeds the ¼ wavelength of the series resonance current waveform when the gate input capacitor C4 is charged. The timing when the switching element S3 is turned off may be within a period of time immediately before the switching element S1 is turned on to turn off the driven element 3, after the wavelength exceeds the ¼ wavelength of the series resonance current waveform when the gate input capacitor C3 is discharged. The timing when the switching element S4 is turned off may be within a period of time immediately before the switching element S2 is turned on to turn off the driven element 4, after the wavelength exceeds the ¼ wavelength of the series resonance current waveform when the gate input capacitor C4 is discharged. Therefore, the temporal restriction of when the energy is returned to the direct-current power supply E1 can be reduced.

In the gate driving circuit according to the second embodiment, since a rising edge and a falling edge of the waveform of the gate voltage are not rapid, generation of the noise is small.

What is claimed is:

1. A gate driving circuit for driving switching element having a gate input capacitor comprising:
   a primary circuit; and
   a secondary circuit, wherein the primary circuit comprises:
      a direct-current power supply;
      a primary winding;
      a first switching element connected between a first end of the primary winding and a positive electrode of the direct-current power supply;
      a first unidirectional element connected in parallel with the first switching element so that a forward direction of the first unidirectional element is toward the positive electrode of the direct-current power supply;
      a second switching element connected between a second end of the primary winding and a negative electrode of the direct-current power supply; and
      a second unidirectional element connected in parallel with the second switching element so that a forward direction of the second unidirectional element is toward the other end of the primary winding, wherein the secondary circuit comprises:
      a secondary winding;
      an inductance element;
      a third switching element; and
      a third unidirectional element connected in parallel with the third switching element, the secondary circuit being configured so that the secondary winding, the inductance element, the third switching element, and the gate input capacitor form a closed circuit, the secondary winding being magnetically coupled to the primary winding to form a transformer, the first switching element and the second switching element are configured to charge the gate input capacitor, the third switching element is configured to discharge the gate input capacitor, when the first switching element and the second switching element are on, in the primary circuit, a first current flows through the first switching element and the second switching element, in the secondary circuit, a charge current generated based on the first current flows through the third unidirectional element, and when the third switching element is on, in the secondary circuit, a discharge current flows through the third switching element, in the primary circuit, a second current generated based on the discharge current flows through the first unidirectional element and the second unidirectional element.

2. The gate driving circuit according to claim 1, wherein the primary circuit further comprises:
   a fourth unidirectional element connected between the first end of the primary winding and the negative electrode of the direct-current power supply so that a forward direction of the fourth unidirectional element is toward the first end of the primary winding; and
   a fifth unidirectional element, connected between the second end of the primary winding and the positive electrode of the direct-current power supply so that a forward direction of the fifth unidirectional element is toward the positive electrode of the direct-current power supply.

* * * * *